US012622320B2

(12) United States Patent
Kim

(10) Patent No.: US 12,622,320 B2
(45) Date of Patent: May 5, 2026

(54) SEMICONDUCTOR PACKAGE

(71) Applicant: SAMSUNG ELECTRONICS CO., LTD., Suwon-si (KR)

(72) Inventor: Seungmin Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 473 days.

(21) Appl. No.: 17/734,451

(22) Filed: May 2, 2022

(65) Prior Publication Data

US 2022/0399322 A1     Dec. 15, 2022

(30) Foreign Application Priority Data

Jun. 15, 2021     (KR) ........................ 10-2021-0077421

(51) Int. Cl.
*H01L 25/18*          (2023.01)
*H01L 23/00*          (2006.01)
(Continued)

(52) U.S. Cl.
CPC .......... *H01L 25/18* (2013.01); *H01L 23/3107* (2013.01); *H01L 23/3142* (2013.01);
(Continued)

(58) Field of Classification Search
CPC ............. H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 2224/2969; H01L 2224/2919; H01L 2224/8385–8389; H01L 24/45;
(Continued)

(56) References Cited

U.S. PATENT DOCUMENTS

| | | |
|---|---|---|
| 9,209,161 B2 | 12/2015 | Jung |
| 9,355,969 B2 | 5/2016 | Park |

(Continued)

FOREIGN PATENT DOCUMENTS

| | | |
|---|---|---|
| KR | 10-2015-0012780 A | 2/2015 |
| KR | 10-2018-0052351 A | 5/2018 |

(Continued)

OTHER PUBLICATIONS

Office Action dated May 19, 2025, issued by Korean Patent Office in Korean Patent Application No. 10-2021-0077421.

*Primary Examiner* — Wael M Fahmy
*Assistant Examiner* — Quinton A Brasfield
(74) *Attorney, Agent, or Firm* — Sughrue Mion, PLLC

(57) ABSTRACT

A semiconductor package is provided. The semiconductor package includes: a package substrate; a first semiconductor chip mounted on the package substrate; a second semiconductor chip mounted on the package substrate; an adhesive film provided on an upper surface the first semiconductor chip and an upper surface of the second semiconductor chip; and a third semiconductor chip attached to the first semiconductor chip, the second semiconductor chip by the adhesive film. The first and second semiconductor chips have different heights, and a thickness of the adhesive film at a portion thereof contacting the first semiconductor chip is different from a thickness of the adhesive film at a portion thereof contacting the second semiconductor chip.

17 Claims, 17 Drawing Sheets

(51) Int. Cl.
  *H01L 23/31* (2006.01)
  *H01L 25/065* (2023.01)

(52) U.S. Cl.
  CPC .............. *H01L 24/16* (2013.01); *H01L 24/32* (2013.01); *H01L 24/48* (2013.01); *H01L 24/73* (2013.01); *H01L 25/0652* (2013.01); *H01L 25/0655* (2013.01); *H01L 25/0657* (2013.01); *H01L 2224/16225* (2013.01); *H01L 2224/32145* (2013.01); *H01L 2224/48227* (2013.01); *H01L 2224/73253* (2013.01); *H01L 2224/73265* (2013.01); *H01L 2924/181* (2013.01); *H01L 2924/3511* (2013.01)

(58) Field of Classification Search
  CPC ..................... H01L 24/48; H01L 24/85; H01L 2224/48227; H01L 2224/73265; H01L 2225/0651; H01L 23/3185; H01L 23/3157; H01L 21/56; H01L 21/563; H01L 23/5389; H01L 2224/2908–29082
  See application file for complete search history.

(56) References Cited

U.S. PATENT DOCUMENTS

| | | | | |
|---|---|---|---|---|
| 9,520,352 | B2 | 12/2016 | Arisaka et al. | |
| 9,613,931 | B2 | 4/2017 | Lin et al. | |
| 10,062,678 | B2 | 8/2018 | Fogal et al. | |
| 10,373,940 | B2 * | 8/2019 | Lee | H01L 24/32 |
| 10,651,133 | B2 * | 5/2020 | Lee | H01L 23/5385 |
| 2014/0185254 | A1 | 7/2014 | Mok et al. | |
| 2015/0028472 | A1 * | 1/2015 | Jung | H01L 25/0657 |
| | | | | 257/737 |
| 2020/0091029 | A1 * | 3/2020 | Jeng | H01L 21/4871 |
| 2020/0168550 | A1 * | 5/2020 | Ryu | H01L 21/568 |
| 2021/0159213 | A1 * | 5/2021 | Kim | H01L 24/32 |
| 2023/0253366 | A1 * | 8/2023 | Taniguchi | H01L 25/0657 |
| | | | | 257/678 |

FOREIGN PATENT DOCUMENTS

| | | | |
|---|---|---|---|
| KR | 10-2021-0066049 | A | 6/2021 |
| WO | 2021038785 | A1 | 3/2021 |

* cited by examiner

FIG. 1
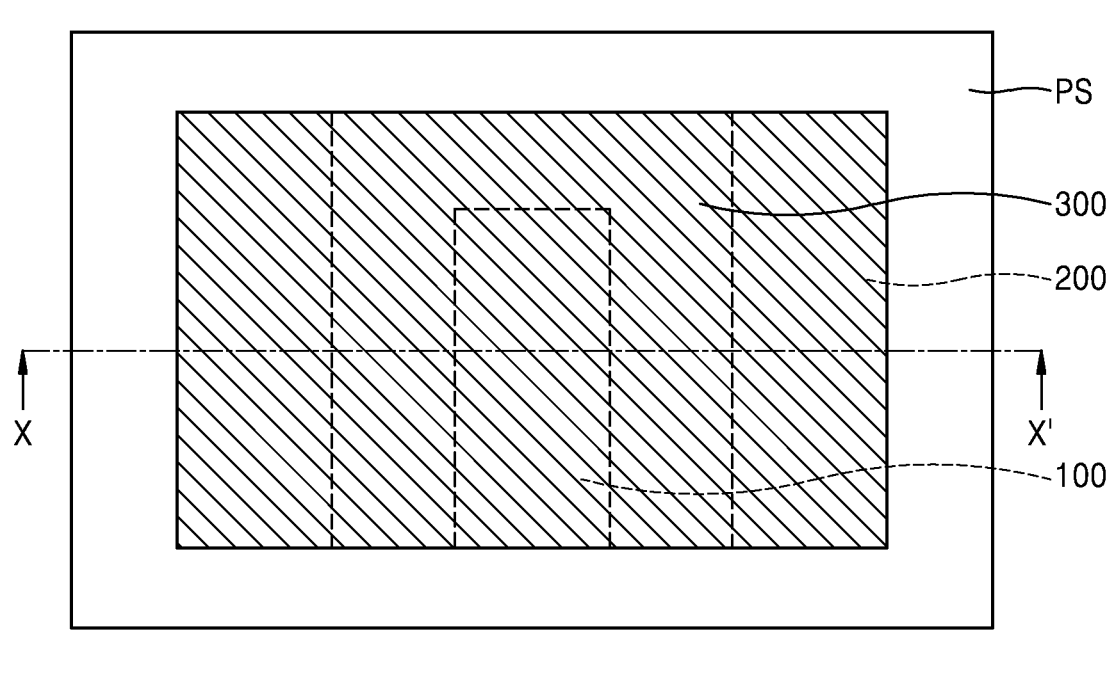
10
PS
300
200
X                                                                    X'
100
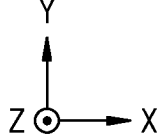

FIG. 10

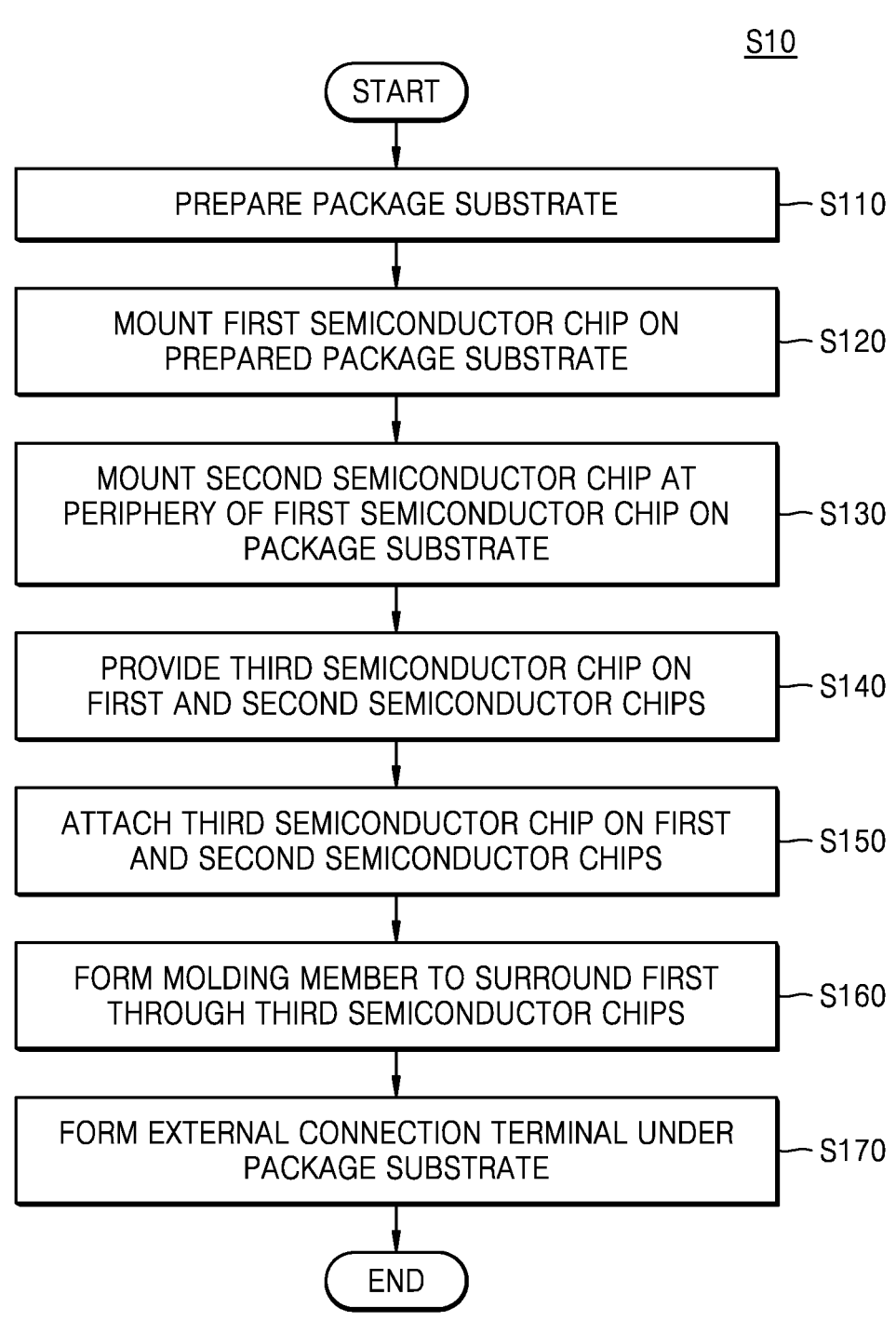

S10

START

PREPARE PACKAGE SUBSTRATE — S110

MOUNT FIRST SEMICONDUCTOR CHIP ON PREPARED PACKAGE SUBSTRATE — S120

MOUNT SECOND SEMICONDUCTOR CHIP AT PERIPHERY OF FIRST SEMICONDUCTOR CHIP ON PACKAGE SUBSTRATE — S130

PROVIDE THIRD SEMICONDUCTOR CHIP ON FIRST AND SECOND SEMICONDUCTOR CHIPS — S140

ATTACH THIRD SEMICONDUCTOR CHIP ON FIRST AND SECOND SEMICONDUCTOR CHIPS — S150

FORM MOLDING MEMBER TO SURROUND FIRST THROUGH THIRD SEMICONDUCTOR CHIPS — S160

FORM EXTERNAL CONNECTION TERMINAL UNDER PACKAGE SUBSTRATE — S170

END

FIG. 13
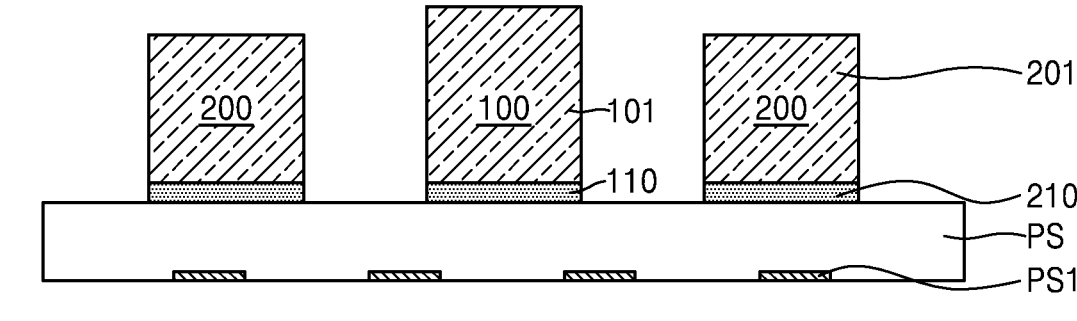
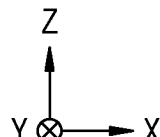

FIG. 15
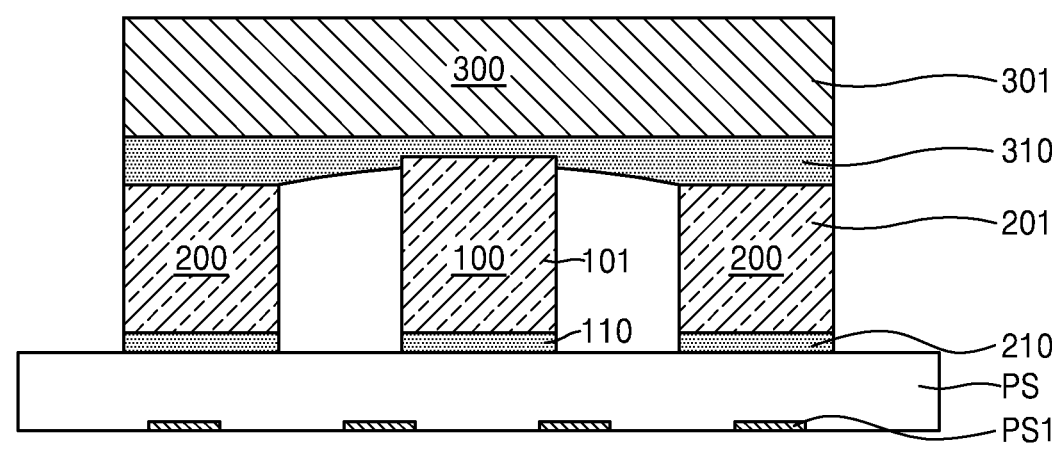
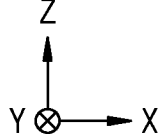

FIG. 16
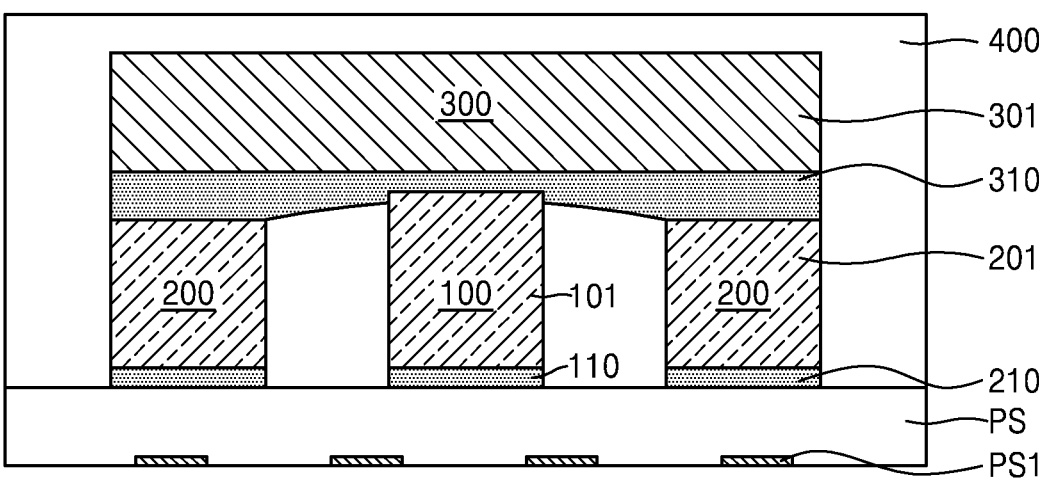
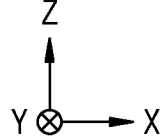

SEMICONDUCTOR PACKAGE

CROSS-REFERENCE TO RELATED APPLICATION

This application claims priority to Korean Patent Application No. 10-2021-0077421, filed on Jun. 15, 2021 in the Korean Intellectual Property Office, the disclosure of which is incorporated by reference herein in its entirety.

BACKGROUND

Methods, apparatuses and systems consistent with example embodiments relate to a semiconductor package, and more particularly, to a system in package in which different types of semiconductor chips are included in a semiconductor package.

Demand for portable devices that are lightweight and compact has rapidly increased in the electronic product market, and accordingly, there is a need for electronic components mounted on the electronic products have to be light and miniaturized. For the electronic components to be light and miniaturized, the semiconductor packages mounted thereon are required to process a large amount of data while a volume thereof is decreased. Accordingly, there is a need for high integration and single packaging of semiconductor chips mounted on the semiconductor packages is required.

SUMMARY

One or more example embodiments provide a semiconductor package including semiconductor chips having different thicknesses and on lower ends thereof, to efficiently protect different types of semiconductor chips in a limited structure of the semiconductor package.

Issues solved by example embodiments are not limited to the above-mentioned issues, and other issues not mentioned may be resolved by example embodiments in view of the following description.

According to an aspect of an example embodiment, a semiconductor package includes: a package substrate; a first semiconductor chip mounted on the package substrate; a second semiconductor chip mounted on the package substrate; an adhesive film provided on an upper surface the first semiconductor chip and an upper surface of the second semiconductor chip; and a third semiconductor chip attached to the first semiconductor chip, the second semiconductor chip by the adhesive film. A first distance from an upper surface of the package substrate to the upper surface of the first semiconductor chip is different than a second distance from the upper surface of the package substrate to the upper surface of the second semiconductor chip, and a first thickness of the adhesive film at a portion thereof contacting the first semiconductor chip is different from a second thickness of the adhesive film at a portion thereof contacting the second semiconductor chip.

According to an aspect of an example embodiment, a semiconductor package includes: a printed circuit board; a first semiconductor chip mounted on the printed circuit board by a first ball grid array; a second semiconductor chip mounted on the printed circuit board mounted on the printed circuit board by a second ball grid array; an adhesive film provided on an upper surface the first semiconductor chip and an upper surface of the second semiconductor chip; and a third semiconductor chip attached to the first semiconductor chip and the second semiconductor chip by the adhesive film. An inactive surface of the first semiconductor chip, which contacts the adhesive film, is farther from the printed circuit board than an inactive surface of the second semiconductor chip.

According to an aspect of an example embodiment, a semiconductor package includes: a plurality of lower semiconductor chips apart from each other, the plurality of lower semiconductor chips including a first lower semiconductor chip and a second lower semiconductor chip; a molding member filling interspaces between the plurality of lower semiconductor chips; an adhesive film provided on an active surface of the plurality of lower semiconductor chips and the molding member; and an upper semiconductor chip provided on the adhesive film. The first lower semiconductor chip is narrower and has a smaller plan area than the second lower semiconductor chip.

According to an aspect of an example embodiment, a semiconductor package includes: a package substrate; a first semiconductor chip mounted on the package substrate; a first bonding wire connecting the first semiconductor chip to the package substrate; a plurality of second semiconductor chips mounted on the package substrate around the first semiconductor chip; a plurality of second bonding wires connecting the plurality of second semiconductor chips to the package substrate; and a third semiconductor chip attached to the first semiconductor chip and the plurality of second semiconductor chips by an adhesive film. Each of the plurality of second semiconductor chips includes a plurality of stacked volatile memories, the third semiconductor chip includes a plurality of stacked non-volatile memories, a first distance from an upper surface of the package substrate to the upper surface of the first semiconductor chip is different than a second distance from the upper surface of the package substrate to the upper surface one of the plurality of second semiconductor chips, and a first thickness of the adhesive film at a portion thereof contacting the first semiconductor chip is different from a second thickness of the adhesive film at a portion thereof contacting the second semiconductor chips.

BRIEF DESCRIPTION OF THE DRAWINGS

The above and other aspects, features, and advantages will be more clearly understood from the following description, taken in conjunction with the accompanying drawings in which:

FIG. 1 is a plan view of main components of a semiconductor package, according to an example embodiment;

FIG. 10 is a flowchart of a process sequence of a method of manufacturing a semiconductor package, according to an example embodiment;

FIGS. 11 through 16 are cross-sectional views illustrating a method of manufacturing a semiconductor package according to example embodiments.

DETAILED DESCRIPTION

Hereinafter, example embodiments are described in detail with reference to the accompanying drawings. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
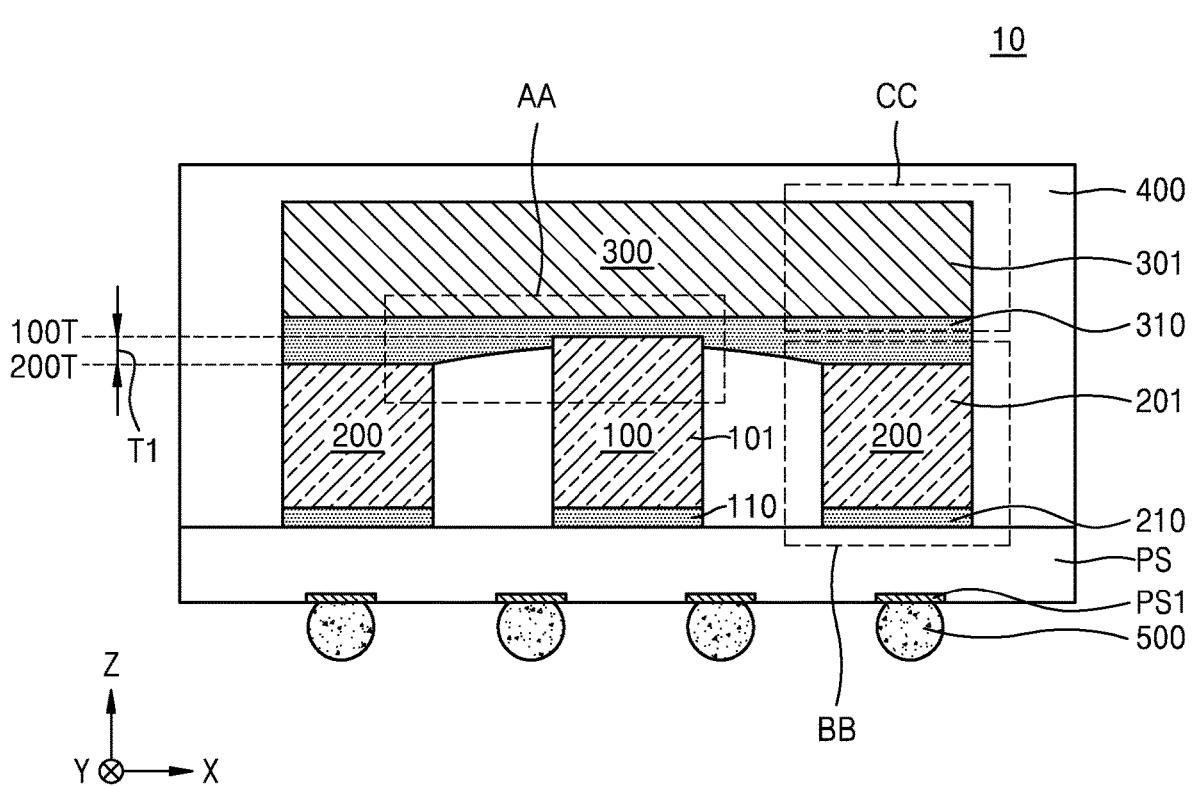
FIG. 2 is a cross-sectional view of main components taken along line X-X' in FIG. 1.
Figure 3:
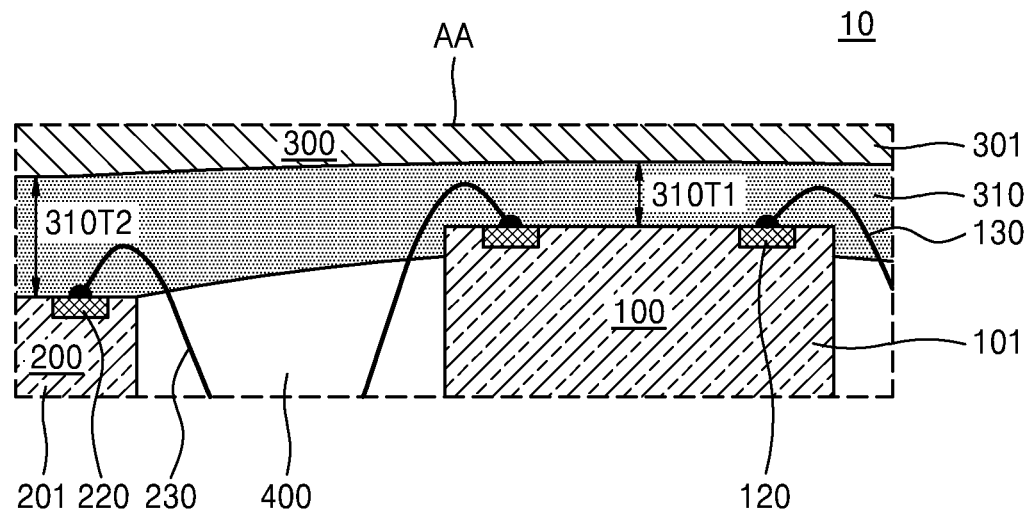
FIGS. 3 through 5 are enlarged, detailed cross-sectional views of main components in FIG. 2.
Figure 4:
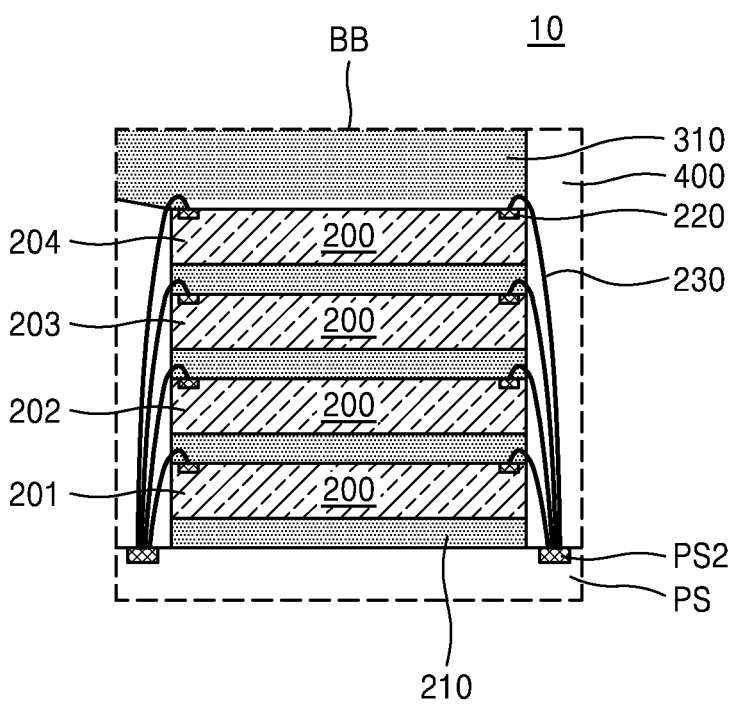
Figure 5:
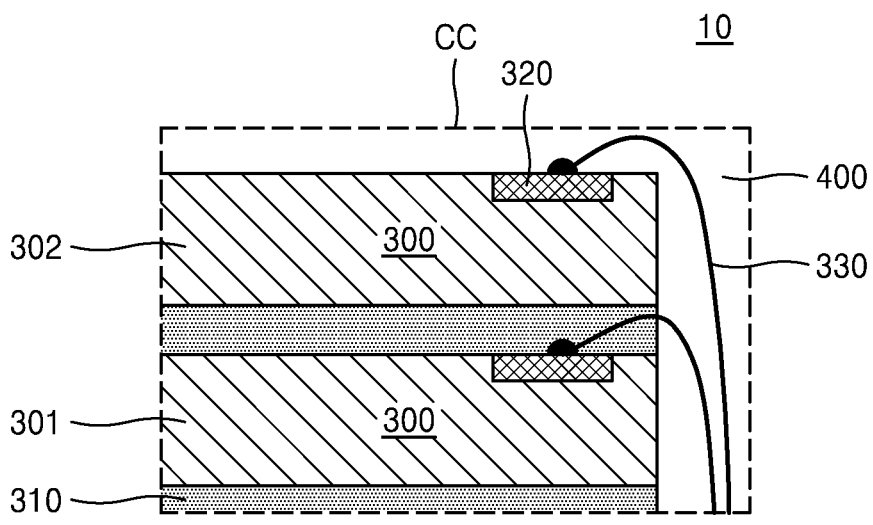

FIG. 1 is a plan view of main components of a semiconductor package, according to an example embodiment, FIG. 2 is a cross-sectional view of main component taken along line X-X' in FIG. 1, FIG. 3 is an enlarged cross-sectional view of region AA in FIG. 2, FIG. 4 is an enlarged cross-sectional view of region BB in FIG. 2, and FIG. 5 is an enlarged cross-sectional view of region CC in FIG. 2.

Referring to FIGS. 1 through 5, a semiconductor package 10 including a package substrate PS, first, second, and third semiconductor chips 100, 200, and 300, a molding member 400, and an external connection terminal 500 is illustrated.

The semiconductor package 10 may have a structure in which a plurality of semiconductor chips are mounted on the package substrate PS. In FIGS. 1 and 2, it is illustrated that a total of four semiconductor chips are mounted on the package substrate PS, but the number of the semiconductor chips is not limited thereto.

The first, second, and third semiconductor chips 100, 200, and 300 may be arranged apart from each other in a first horizontal direction (X direction) and a second horizontal direction (Y direction) crossing each other on an upper surface of the package substrate PS, and may be mounted in a stacked shape in a vertical direction (Z direction) perpendicular to the upper surface of the package substrate PS.

For convenience of description, the same type of semiconductor chips may be treated as one. In other words, the first, second, and third semiconductor chips 100, 200, and 300 may be used to denote that there are three different types of semiconductor chips.

In some example embodiments, the first semiconductor chip 100 may include a non-memory chip, and the second and third semiconductor chips 200 and 300 may include memory chips. The first semiconductor chip 100 may include a controller chip or a logic chip, the second semiconductor chip 200 may include a volatile memory chip, and a third semiconductor chip 300 may include a non-volatile memory chip. However, the types of the first, second, and third semiconductor chips 100, 200, and 300 are not limited thereto.

A non-memory chip constituting the first semiconductor chip 100 may be implemented as, for example, a controller, a microprocessor, a graphics processor, a signal processor, a network processor, a chipset, an audio codec, a video codec, an application processor, a system on chip, or the like, but is not limited thereto. The microprocessor may include, for example, a single core or a multi-core.

A volatile memory constituting the second semiconductor chip 200 may include, for example, an existing volatile memory chip such as dynamic random access memory (RAM) (DRAM), static RAM (SRAM), thyristor RAM (TRAM), zero capacitor RAM (ZRAM), and twin transistor RAM (TTRAM), and a volatile memory chip under development. Alternatively, the volatile memory chip may include a high bandwidth memory chip.

A non-volatile memory constituting the third semiconductor chip 300 may include, for example, an existing non-volatile memory chip such as a flash memory, magnetic RAM (MRAM), spin-transfer-torque RAM (STT-MRAM), ferroelectric RAM (FRAM), phase change RAM (PRAM), resistive RAM (RRAM), nanotube RRAM, polymer RAM, a nano floating gate memory, a holographic memory, a molecular electronics memory, and an insulator resistance change memory, and a non-volatile memory chip under development.

In other example embodiments, the first and third semiconductor chips 100 and 300 may include an active chip, and the second semiconductor chip 200 may include a dummy chip. However, the types of the first, second, and third semiconductor chips 100, 200, and 300 are not limited thereto.

A dummy chip constituting the second semiconductor chip 200 may be arranged in an empty region where an active chip is not on the package substrate PS, and may act as a support member to support other semiconductor chips. When the first and third semiconductor chips 100 and 300 are constituted with a semiconductor substrate such as a silicon wafer, a dummy chip constituting the second semiconductor chip 200 may include the same or similar material.

Detailed descriptions on components of each of the first, second, and third semiconductor chips 100, 200, and 300 are given below.

The first semiconductor chip 100 may include a first semiconductor substrate 101, a first adhesive film 110, a first connection pad 120, and a first connection member 130. For convenience of explanation, the first adhesive film 110 may be included as a component of the first semiconductor chip 100, but example embodiments are not limited thereto.

The first semiconductor substrate 101 may have an active surface and an inactive surface opposite to the active surface. In this case, the inactive surface of the first semiconductor substrate 101 may include a face facing the upper surface of the package substrate PS. A plurality of active/passive components may be formed on the active surface of the first semiconductor substrate 101, and the first connection pad 120 may be formed thereon.

The first semiconductor substrate 101 may include, for example, silicon. Alternatively, the first semiconductor substrate 101 may include a semiconductor element such as germanium (Ge), or a compound semiconductor such as silicon carbide (SiC), gallium arsenide (GaAs), indium arsenide (InAs), and indium phosphide (InP). Alternatively, the first semiconductor substrate 101 may have a silicon on insulator (SOI) structure. For example, the first semiconductor substrate 101 may include a buried oxide (BOX) layer. The first semiconductor substrate 101 may include a conductive region, for example, a well doped with impurities, or a structure doped with impurities. In addition, the first semiconductor substrate 101 may have various device isolation structures such as a shallow trench isolation (STI) structure.

The first adhesive film 110 may be between the inactive surface of the first semiconductor chip 100 and the package substrate PS. The first semiconductor chip 100 may be stably attached to the package substrate PS by the first adhesive film 110. The first adhesive film 110 may include, for example, a die attach film (DAF). The DAF may be categorized into an inorganic adhesive and a polymer adhesive, and may be of a hybrid type in which the inorganic adhesive is combined with the polymer adhesive.

The first connection pad 120 may be arranged on the active surface of the first semiconductor chip 100, and may be electrically connected to a semiconductor wiring layer in the first semiconductor chip 100. The semiconductor wiring layer may be electrically connected to the first connection member 130 via the first connection pad 120. The first connection pad 120 may include, for example, aluminum (Al), copper (Cu), nickel (Ni), tungsten (W), platinum (PT), and gold (Au).

The first connection member 130 may be electrically connected to the first semiconductor chip 100 and the package substrate PS. The first connection member 130 may include a bonding wire attached to the first connection pad 120 in a ball bonding method. A material constituting the bonding wire may include at least one of Au, silver (Ag), Cu, and Al. In some example embodiments, the bonding wire may be connected to the first connection pad 120 by using any one of a thermo compression connection method and an ultrasonic connection method, and may be also connected to the first connection pad 120 by using a thermo sonic connection method, which combines the thermo compression connection method with the ultrasonic connection method.

At least one of a control signal, a power signal, and a ground signal for an operation of the first semiconductor chip 100 may be externally provided via the first connection member 130, or a data signal indicating data to be stored in the first semiconductor chip 100 may be externally provided, or a data signal indicating data stored in the first semiconductor chip 100 may be provided to the outside.

As described above, the second semiconductor chip 200 may include a volatile memory chip, or in some cases, may include a dummy chip. Accordingly, the second semiconductor chip 200 is described for each case.

In an example embodiment, the second semiconductor chip 200 may include a second semiconductor substrate 201, a second connection pad 220, and a second connection member 230. The second semiconductor chip 200 may be configured with a plurality of slices, and the plurality of slices may be configured as a plurality of second semiconductor substrates 201, 202, 203, and 204. The plurality of second semiconductor substrates 201, 202, 203, and 204 may constitute a chip stack, in which the second semiconductor substrates 201, 202, 203, and 204 are stacked in the vertical direction (Z direction). The plurality of second semiconductor substrates 201, 202, 203, and 204 may be substantially the same as each other. For example, the second semiconductor chip 200 may include the plurality of slices each operating as a volatile memory chip, and may have a structure in which the plurality of slices are stacked.

The second semiconductor substrate 201 may have an active surface and an inactive surface opposite to the active surface. In this case, the inactive surface of the second semiconductor substrate 201 may include a face facing the upper surface of the package substrate PS. A plurality of memory components may be formed on the active surface of the second semiconductor substrate 201, and the second connection pad 220 may be formed on the active surface of the second semiconductor substrate 201.

A second adhesive film 210 may be between each two of the plurality of second semiconductor substrates 201, 202, 203, and 204, which constitute the second semiconductor chip 200, and between the second semiconductor chip 200 and the package substrate PS. The second semiconductor chip 200 may be stably attached to and stacked on the package substrate PS by the second adhesive film 210. The second adhesive film 210 may include, for example, the DAF.

The second connection pad 220 may be arranged on the active surface of the second semiconductor chip 200, and the second connection member 230 may be arranged to electrically connect the second semiconductor chip 200 to the package substrate PS.

In another example embodiment, when the second semiconductor chip 200 includes a dummy chip performing only a role as the support member, the second semiconductor chip 200 may be configured as one second semiconductor substrate 201. In addition, in this case, memory elements, the second connection pad 220, and the second connection member 230 may not be formed in the second semiconductor chip 200. In other words, the dummy chip may, like a so-called dolmen structure, perform only a role of structurally supporting so that the third semiconductor chip 300 does not fall or bend.

The third semiconductor chip 300 may include a third semiconductor substrate 301, a third connection pad 320, and a third connection member 330. The third semiconductor chip 300 may include a plurality of third semiconductor substrates 301 and 302. The plurality of third semiconductor substrates 301 and 302 may constitute a chip stack, in which the third semiconductor substrate 301 and the third semiconductor substrate 302 are stacked in the vertical direction (Z direction). The plurality of third semiconductor substrates 301 and 302 may be substantially the same as each other. For example, the third semiconductor chip 300 may include the plurality of slices each operating as a non-volatile memory chip, and may have a structure in which the plurality of slices are stacked.

The third semiconductor substrate 301 may have an active surface and an inactive surface opposite to the active surface. In this case, the inactive surface of the third semiconductor substrate 301 may include a face facing the upper surface of the package substrate PS. A plurality of memory components may be formed on the active surface of the third semiconductor substrate 301, and the third connection pad 320 may be formed thereon.

The third adhesive film 310 may be arranged on a lower portion of the third semiconductor chip 300. In other words, the third semiconductor chip 300 may be arranged on an upper surface of the third adhesive film 310, and the first and second semiconductor chips 100 and 200 may be arranged on a lower surface of the third adhesive film 310. The third semiconductor chip 300 may be stably attached to and stacked on the first and second semiconductor chips 100 and 200, by the third adhesive film 310. The third adhesive film 310 may include, for example, the DAF.

The third connection pad 320 may be arranged on the active surface of the third semiconductor chip 300, and the third connection member 330 may be arranged to electrically connect the third semiconductor chip 300 to the package substrate PS.

In addition to previous descriptions, the second and third semiconductor chips 200 and 300 may have characteristics substantially the same as or similar to the first semiconductor chip 100, and thus, detailed descriptions on the second and third semiconductor chips 200 and 300 are omitted.

In the semiconductor package 10 according to example embodiments, one of the first semiconductor chips 100 may be between the plurality of second semiconductor chips 200. In addition, a plan area (i.e., a side surface area) of the one of the first semiconductor chips 100 may be greater than a plan area of each of the plurality of second semiconductor chips 200. In addition, the third semiconductor chip 300 may be arranged to be stacked on the one of the first semiconductor chips 100 and the plurality of second semiconductor chips 200 by the third adhesive film 310. As a result, the first connection member 130 and the second connection member 230 may be arranged to pass through the interior of the third adhesive film 310.

In the semiconductor package 10, sidewalls of the plurality of second semiconductor chips 200 may be arranged side by side with sidewalls of the third semiconductor chip 300 in the vertical direction (Z direction). One of the plurality of second semiconductor chips 200 may be arranged on the same plane as one sidewall of the third semiconductor chip 300 in the vertical direction (Z direction), and the other of the plurality of second semiconductor chips 200 may be arranged on the same plane as the other sidewall of the third semiconductor chip 300 in the vertical direction (Z direction). However, the arrangement of the first, second, and third semiconductor chips 100, 200, and 300 is not limited thereto.

In the semiconductor package 10, a level of an uppermost surface 100T of the first semiconductor chip 100 may be higher (i.e., farther from the package substrate PS) than a level of an uppermost surface 200T of the second semiconductor chip 200. Accordingly, the uppermost surface 100T of the first semiconductor chip 100 may be higher than the uppermost surface 200T of the second semiconductor chip 200 by a first interval T1. In this case, the first interval T1 may be about 20 µM to about 100 µm, but is not limited thereto. In other words, a thickness of the first semiconductor chip 100 may be greater than a thickness of the second semiconductor chip 200.

In the semiconductor package 10, the third semiconductor chip 300 may be formed so that a portion thereof facing the uppermost surface 100T of the first semiconductor chip 100 is concave. As to be described below, the third semiconductor chip 300 may have warpage in a certain direction.

Due to the above-described characteristics, in the semiconductor package 10, an upper portion of the first semiconductor chip 100 may be buried in the third adhesive film 310. In other words, the third adhesive film 310 may contact the uppermost surface 100T of the first semiconductor chip 100, and in addition, may contact a portion of a sidewall extending from the uppermost surface 100T of the first semiconductor chip 100. In addition, a first thickness 310T1 of a portion of the third adhesive film 310 contacting the first semiconductor chip 100 may be less than a second thickness 310T2 of a portion of the third adhesive film 310 contacting the second semiconductor chip 200.

Detailed descriptions on components except for the first, second, and third semiconductor chips 100, 200, and 300 are given below.

The package substrate PS may, as a support substrate, include a body portion, a lower protection layer, and an upper protection layer. The package substrate PS may be formed with, as a base, a printed circuit board (PCB), a wafer substrate, a ceramic substrate, a glass substrate, an interposer, etc. According to example embodiments, the package substrate PS may include a PCB. However, the package substrate PS is not limited to a PCB.

The external connection terminal 500 may be arranged on a lower electrode pad PS1 on a lower surface of the package substrate PS. The package substrate PS may be electrically connected to a module substrate, a system board, or the like, of an electronic product via the external connection terminal 500.

In addition, wiring may be formed on the package substrate PS, and the wiring may be electrically connected to the first, second, and third semiconductor chips 100, 200, and 300 via the first, second, and third connection members 130, 230, and 330 connected to an upper electrode pad PS2 on the upper surface of the package substrate PS.

The molding member 400 may surround side surfaces, lower surfaces, and upper surfaces of the first, second, and third semiconductor chips 100, 200, and 300. For convenience of descriptions, the inside of the molding member 400 is illustrated as transparent in the drawings, but the molding member 400 is not limited thereto.

The molding member 400 may include an epoxy molding compound. The epoxy molding compound may have a Young's modulus of about 15 GPa to about 30 GPa, and a coefficient of thermal expansion of about 3 ppm to about 30 ppm. The molding member 400 may not be limited to the epoxy molding compound, but may include various materials, for example, an epoxy-based material, a thermosetting material, a thermoplastic material, an ultra-violet (UV) treatment material, etc. The thermosetting material may include a curing agent of a phenol type, an anhydride type, and an amine type, and an additive of acrylic polymer.

The molding member 400 may be formed by using a molded underfill (MUF) process, and accordingly, a material provided on the outer periphery of the first, second, and third semiconductor chips 100, 200, and 300 may be the same as a material filling spaces between the first, second, and third semiconductor chips 100, 200, and 300 and the package substrate PS.

The molding member 400 may have a molding material of a proper amount injected on the package substrate PS by using an injection process, and the contour of the semiconductor package 10 may be formed by using a curing process. Pressure may be applied to the molding material in a pressing process using a press, and the contour of the semiconductor package 10 may be formed. In this case, process conditions such as a delay time between injection time and pressurizing time of the molding material, an amount of the molding material to be injected, and a pressurizing temperature/pressure may be set considering physical properties such as viscosity of the molding material.

The molding member 400 may protect the first, second, and third semiconductor chips 100, 200, and 300 from external influences such as contamination and impact. In this regard, a thickness of the molding member 400 may be formed to surround at least all of the first, second, and third semiconductor chips 100, 200, and 300. Because the molding member 400 entirely covers the package substrate PS, a width of the molding member 400 may be substantially the same as a width of the semiconductor package 10.

Recently, the demand for portable devices has rapidly increased in the electronic product market, and accordingly, electronic components mounted on the electronic products have continuously been required to be light and miniaturized. For the electronic components to be light and miniaturized, the semiconductor package 10 mounted thereon is required to process a large amount of data while a volume thereof is decreased.

Therefore, there is a need for integration and single packaging of semiconductor chips mounted on the semiconductor package 10. Accordingly, to efficiently arrange the semiconductor chips in a limited structure of the semiconductor package 10, a system in package has been applied.

However, in a general system in package, different types of semiconductor chips are arranged very close to each other, and molding members filling spaces therebetween are formed. Accordingly, stress occurs between different materials constituting a package substrate, a semiconductor chip, an adhesive member, and a molding member. Accordingly, when temperature changes during a manufacturing process (for example, a curing process) for manufacturing a semiconductor package, each component contracts or expands differently, which causes partial deformation of each component. Defects such as voids may occur in a region where the stress is maximized (for example, a region where a semiconductor chip contacts an adhesive member). As a result, the molding member penetrates into the void, and cracks occur. In a subsequent process (for example, a process of mounting the semiconductor package on a main board), cracks may spread to a semiconductor chip and cause defects in the semiconductor package.

To solve this issue, in the semiconductor package 10 according to example embodiments, to fully suppress the stress occurring due to differences between materials in a region where the first, second, and third semiconductor chips 100, 200, and 300 face each other, and minimize the voids in the third adhesive film 310, the first, second, and third semiconductor chips 100, 200, and 300 may be more efficiently arranged on the package substrate PS.

In the semiconductor package 10 according to example embodiments, considering warpage of the third semiconductor chip 300 corresponding to a semiconductor chip, thicknesses of the first and second semiconductor chips 100 and 200 corresponding to semiconductor chips on a lower end thereof may be formed different from each other. In this manner, adhesive areas of the first and second semiconductor chips 100 and 200 that the third adhesive film 310 attaches to are increased. Thus, voids occurring during the curing process may be effectively removed. In other words, defects of the semiconductor package 10 may be prevented by reducing cracks occurring along with the voids inside the semiconductor package 10.

As a result, the semiconductor package 10 according to example embodiments may improve the reliability and the productivity of a product, by reducing defects due to cracks in a highly integrated system in package.

Figure 6:
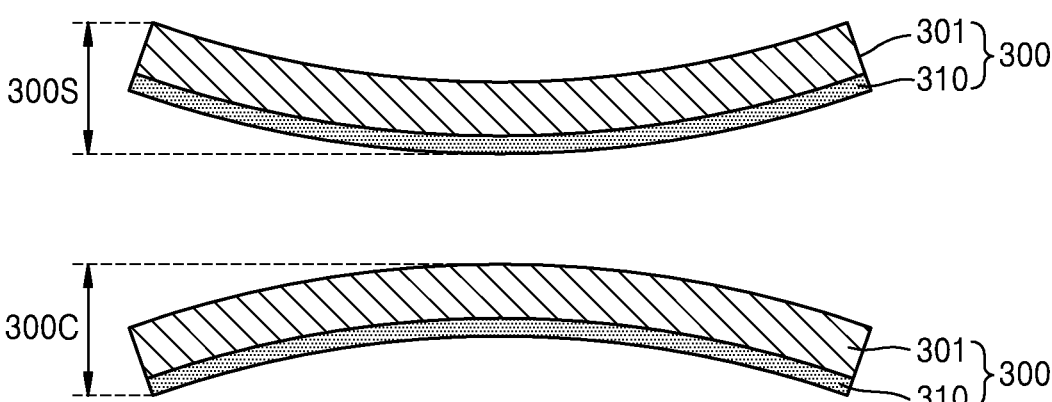
FIG. 6 illustrates schematic cross-sectional views of warpage of a semiconductor chip included in a semiconductor package.

FIG. 6 illustrates schematic cross-sectional views of warpage of a semiconductor chip included in semiconductor package.

Referring to FIG. 6, shapes of the third semiconductor chip 300 including the third semiconductor substrate 301 and the third adhesive film 310 attached to the third semiconductor substrate 301 are illustrated.

When temperature changes during a process of manufacturing the third semiconductor chip 300, materials constituting the third semiconductor chip 300 may shrink or expand, and different materials may shrink or expand at different rates. Such contraction and expansion may cause deformation such as bending in the third semiconductor substrate 301. The deformation of the third semiconductor substrate 301 may be referred to as warpage.

Due to the warpage of the third semiconductor substrate 301, the third semiconductor chip 300 may not be flat, and height differences 300S and 300C between the center portion and a periphery portion thereof may occur. As a result, void defects and cracks as described above for the semiconductor package (refer to 10, FIG. 2) may be caused.

In the semiconductor package (refer to 10, FIG. 2) according to example embodiments, thicknesses of the semiconductor chips on the lower end thereof may be formed differently from each other by reflecting the warpage of the third semiconductor chip 300 corresponding to a semiconductor chip on the upper end thereof. In this manner, by increasing an adhesive area between the semiconductor chips on the lower end of the semiconductor package (refer to 10, FIG. 2) and the third adhesive film 310, voids occurring during the curing process may be effectively removed. In this manner, defects of the semiconductor package (refer to 10, FIG. 2) may be prevented by reducing cracks occurring along with voids in the semiconductor package (refer to 10, FIG. 2).

Figure 7:
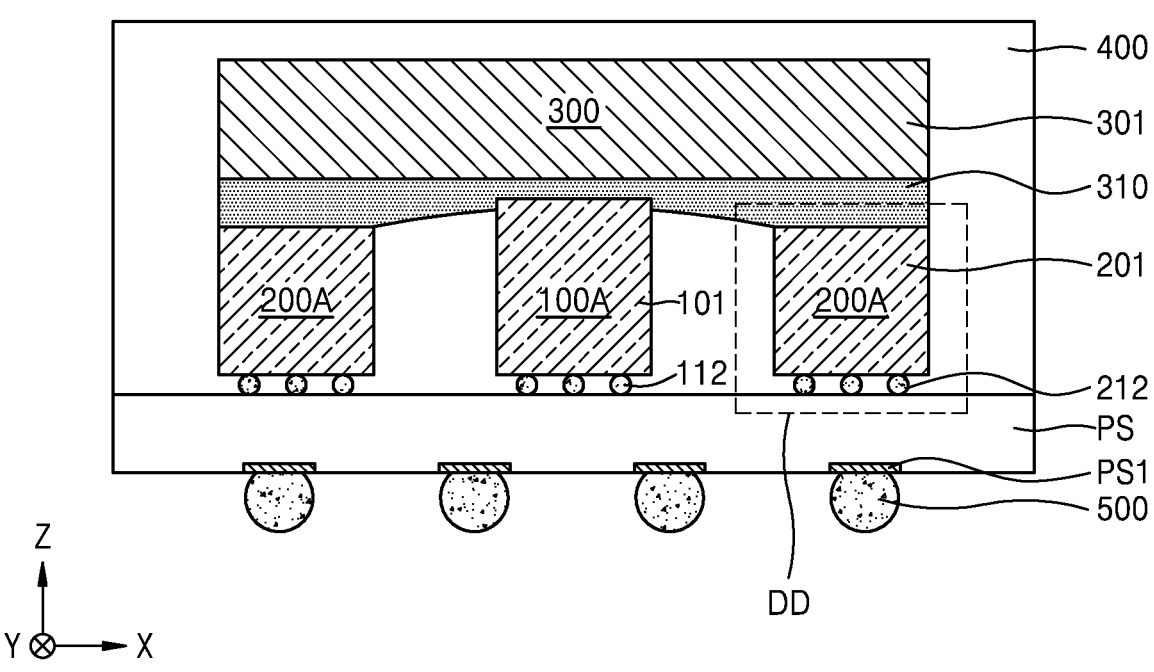
FIG. 7 is a cross-sectional view of main components of a semiconductor package, according to an example embodiment.
Figure 8:
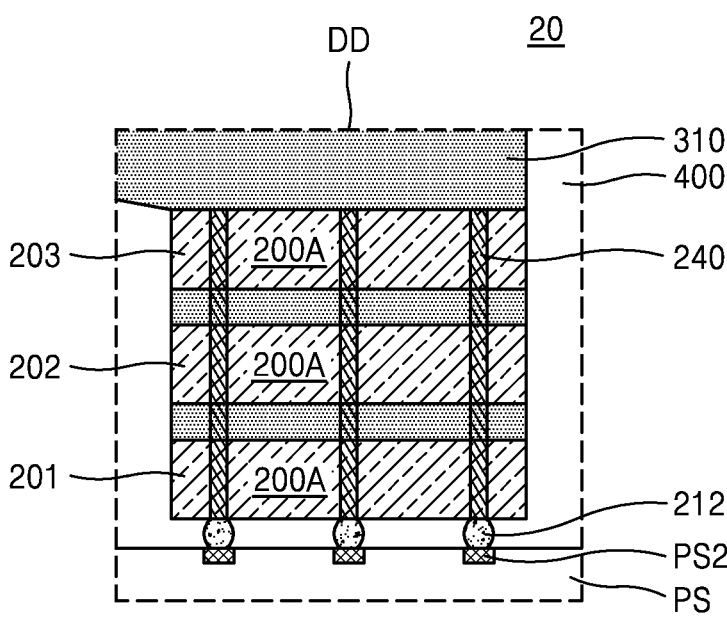
FIG. 8 is an enlarged, detailed cross-sectional view of main components in FIG. 7.

FIG. 7 is a cross-sectional view of main components of a semiconductor package, according to example embodiments, FIG. 8 is an enlarged cross-sectional view of region DD in FIG. 7.

Most of the components constituting the semiconductor package 20 and materials included in the components to be described below may be substantially the same as or similar to those described with reference to FIGS. 1 through 5. Accordingly, for convenience of descriptions, differences from the semiconductor package 10 described above are mainly described.

Referring to FIGS. 7 and 8 together, the semiconductor package 20 including the package substrate PS, first, second, and third semiconductor chips 100A, 200A, and 300, the molding member 400, and the external connection terminal 500 is illustrated.

In the semiconductor package 20, the first semiconductor chip 100A and the second semiconductor chip 200A may be mounted on the package substrate PS by using a ball grid array (BGA) method.

The first semiconductor substrate 101 constituting the first semiconductor chip 100A may be electrically connected to the package substrate PS via a first connection member 112 having a solder bump shape (for example, a solder ball).

A plurality of second semiconductor substrates 201, 202, and 203 constituting the second semiconductor chip 200A may be electrically connected to the package substrate PS via a second connection member 212 having a solder bump shape (for example, a solder ball).

In addition, the second semiconductor chip 200A may include a memory chip set including the plurality of second semiconductor substrates 201, 202, and 203, which are a plurality of slices capable of combining data therebetween.

The number of second semiconductor substrates 201, 202, and 203 constituting the second semiconductor chip 200A may vary according to an application of the semiconductor package 20. In other words, the number of second semiconductor substrates 201, 202, and 203 constituting the second semiconductor chip 200A is not limited to the number shown in FIG. 8.

At least some of the plurality of second semiconductor substrates 201, 202, and 203 constituting the second semiconductor chip 200A may include a through electrode 240 penetrating therethrough. The through electrode 240 may include, for example, a through silicon via (TSV).

Each of the plurality of second semiconductor substrates 201, 202, and 203 may have an active surface and an inactive surface opposite to the active surface. In this case, the active surface of each of the plurality of second semiconductor substrates 201, 202, and 203 may include a surface facing the upper surface of the package substrate PS.

In other words, in the semiconductor package 20, compared to the semiconductor package (refer to 10, FIG. 2), the first semiconductor chip 100A and the second semiconductor chip 200A may not use a bonding wire as a connection member but use a solder ball as a connection member, and thus, may be electrically connected to the package substrate PS.

Figure 9:
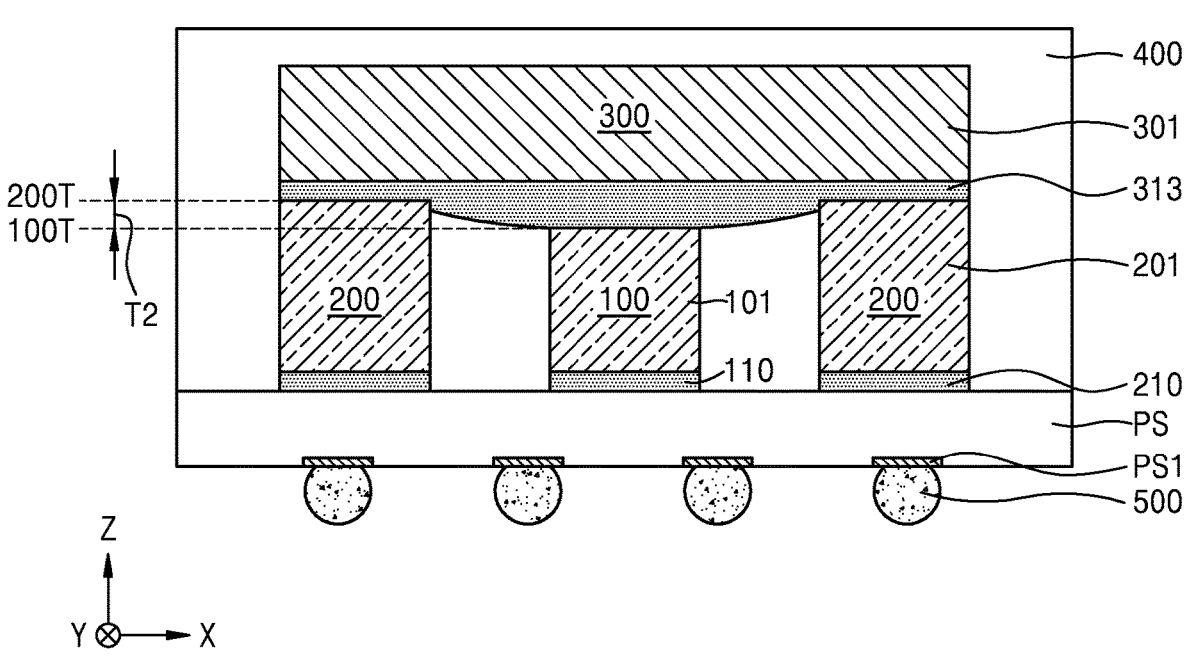
FIG. 9 is a cross-sectional view of main components of a semiconductor package, according to an example embodiment.

FIG. 9 is a cross-sectional view of main components of a semiconductor package 30, according to example embodiments.

Most of the components constituting the semiconductor package 30 and materials included in the components to be described below may be substantially the same as or similar to those described with reference to FIGS. 1 through 5. Accordingly, for convenience of descriptions, differences from the semiconductor package 30 described above are mainly described.

Referring to FIG. 9, the semiconductor package 30 including the package substrate PS, the first, second, and third semiconductor chips 100, 200, and 300, the molding member 400, and the external connection terminal 500 is illustrated.

In the semiconductor package 30, one of the first semiconductor chips 100 may be between the plurality of second semiconductor chips 200. In addition, the third semiconductor chip 300 may be arranged to be stacked on the one of the first semiconductor chips 100 and the plurality of second semiconductor chips 200 by a third adhesive film 313.

In the semiconductor package 30, the level of the uppermost surface 100T of the first semiconductor chip 100 may be lower (i.e., close to the package substrate PS) than the level of the uppermost surface 200T of the second semiconductor chip 200. Accordingly, the uppermost surface 100T of the first semiconductor chip 100 may be lower than the uppermost surface 200T of the second semiconductor chip 200 by a second interval T2. In this case, the second interval T2 may be about 20 μm to about 100 μm, but is not limited thereto. In other words, the thickness of the first semiconductor chip 100 may be less than the thickness of the second semiconductor chip 200.

In the semiconductor package 30, the third semiconductor chip 300 may be formed such that a portion thereof facing the uppermost surface 100T of the first semiconductor chip 100 is convex.

Due to the characteristics, in the semiconductor package 30, the top portion of the second semiconductor chip 200 may be buried in the third adhesive film 313. In other words, the third adhesive film 313 may contact the uppermost surface 200T of the second semiconductor chip 200, and in addition, may contact a portion of a sidewall extending from the uppermost surface 200T of the second semiconductor chip 200.

In other words, in the semiconductor package 30, compared to the semiconductor package (refer to 10, FIG. 2), the second semiconductor chip 200 may be formed thicker than the first semiconductor chip 100, and the third adhesive film 313 may be arranged according a shape thereof.

FIG. 10 is a flowchart of a process sequence of a method S10 of manufacturing a semiconductor package, according to an example embodiment.

Referring to FIG. 10, the method S10 of manufacturing a semiconductor package may include a process sequence of first through seventh operations S110 through S170.

When an example embodiment is implemented differently, a particular process sequence may be executed differently from the sequence to be described. For example, two consecutively described processes may be performed substantially at the same time or in a sequence opposite to the sequence to be described.

The method S10 of manufacturing a semiconductor package according to example embodiments may include operations below, but is not limited thereto.

The method S10 of manufacturing a semiconductor package may include first operation S110 of preparing a package substrate, second operation S120 of mounting a first semiconductor chip on the prepared package substrate, third operation S130 of mounting a second semiconductor chip at a periphery of the first semiconductor chip on the package substrate, fourth operation S140 of locating a third semiconductor chip on the first and second semiconductor chips, fifth operation S150 of attaching the third semiconductor chip on the first and second semiconductor chips, sixth operation S160 of forming a molding member to surround the first through third semiconductor chips, and seventh operation S170 of forming an external connection terminal on a lower surface of the package substrate.

Technical characteristics of each of first through seventh operations S110 through S170 are described in detail below with reference to FIGS. 11 through 16.

FIGS. 11 through 16 are cross-sectional views illustrating a method of manufacturing the semiconductor package according to a process sequence, according to example embodiments.

Figure 11:
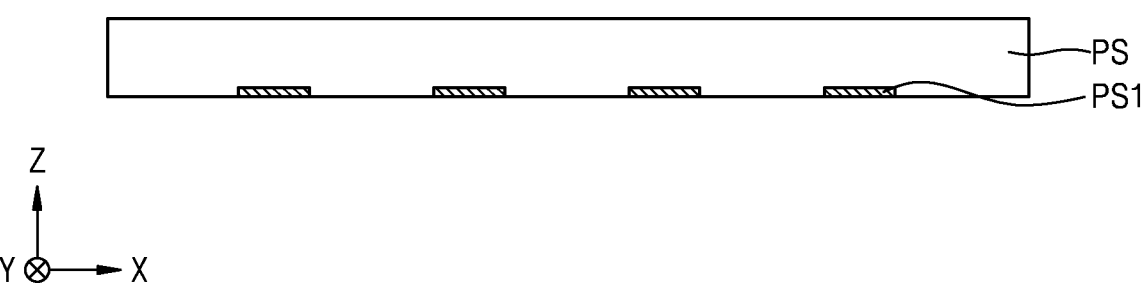

Referring to FIG. 11, firstly, the package substrate PS may be prepared in operation S110.

The package substrate PS may, as a support substrate, include a body portion, a lower protection layer, and an upper protection layer. The package substrate PS may include a PCB, a wafer substrate, a ceramic substrate, a glass substrate, an interposer, etc. In an example embodiment, the package substrate PS may include a PCB.

In the PCB, the body portion may be implemented by pressing, to a certain thickness, a polymer material such as thermosetting resin, epoxy resin or phenolic resin such as flame retardant 4 (FR-4), bismaleimide triazine (BT), and Ajinomoto build-up film (ABF), forming the pressed result into a thin layer, coating copper layers on both sides of the formed thin layer, and forming a wiring, which is a transmission path of electrical signals, by patterning. A lower protection layer and an upper protection layer may be implemented by doping a solder resist on all of a lower surface and an upper surface of the body portion, except for the upper electrode pad PS2 and the lower electrode pad PS1.

The PCB may be a single-side PCB where the wiring is formed on only one side thereof, or a double-side PCB where the wiring is formed on two surfaces thereof. In addition, the number of copper layers may be formed as 3 or more layers by using an insulator such as prepreg, and a PCB having a multi-layer structure may be implemented by forming 3 or more wirings according to the number of formed copper layers.

Figure 12:
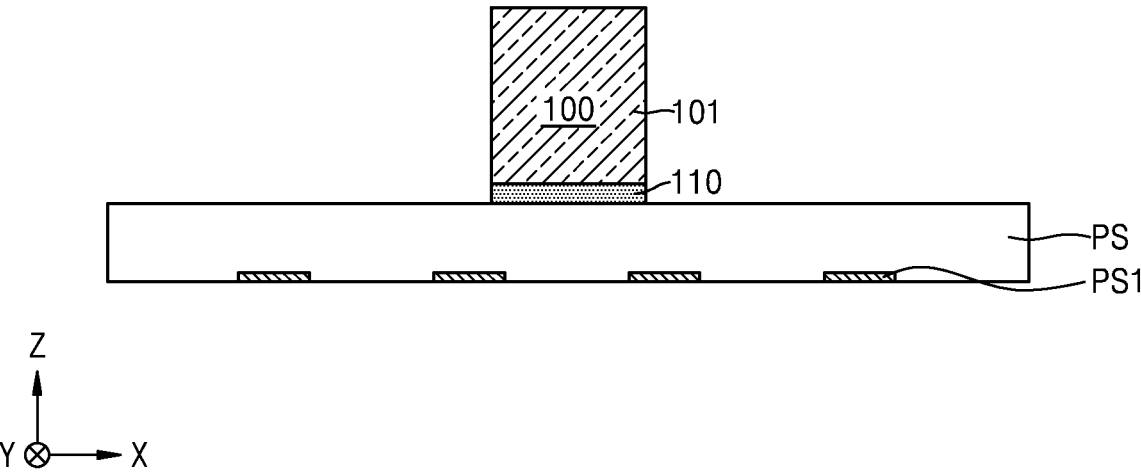

Referring to FIG. 12, the first semiconductor chip 100 may be mounted on the prepared package substrate PS in operation S120.

The first semiconductor chip 100 may be mounted in a chip mounting region at the central portion of the package substrate PS. The first semiconductor chip 100 may include the first semiconductor substrate 101, the first adhesive film 110, a first connection pad, and a first connection member.

The first semiconductor substrate 101 may have an active surface and an inactive surface opposite to the active surface. In this case, the inactive surface of the first semiconductor substrate 101 may include a face facing the upper surface of the package substrate PS. A plurality of active/passive elements may be formed on the active surface of the first semiconductor substrate 101.

The first adhesive film 110 may be between the inactive surface of the first semiconductor chip 100 and the package substrate PS. The first semiconductor chip 100 may be stably attached to the package substrate PS by the first adhesive film 110.

Referring to FIG. 13, the second semiconductor chip 200 may be mounted at the periphery of the first semiconductor chip 100 on the package substrate PS in operation S130.

The plurality of second semiconductor chips 200 may be mounted in a chip mounting region at the periphery portion of the package substrate PS. The second semiconductor chip 200 may include the second semiconductor substrate 201, the second adhesive film 210, a second connection pad, and a second connection member.

The second semiconductor substrate 201 may have an active surface and an inactive surface opposite to the active surface. In this case, the inactive surface of the second semiconductor substrate 201 may include a face facing the upper surface of the package substrate PS. A plurality of memory elements may be formed on the active surface of the second semiconductor substrate 201.

The second adhesive film 210 may be between the inactive surface of the second semiconductor chip 200 and the package substrate PS. The second semiconductor chip 200 may be stably attached to the package substrate PS by the second adhesive film 210.

Alternatively, the second semiconductor chip 200 may include a dummy chip. The dummy chip constituting the second semiconductor chip 200 may be arranged in an empty region where an active chip is not on the package substrate PS, and may perform a role of a support member to support other semiconductor chips.

In an example embodiment, the level of the uppermost surface of the first semiconductor chip 100 may be higher (i.e., farther from the package substrate PS) than the level of the uppermost surface of the second semiconductor chip 200. The uppermost surface of the first semiconductor chip 100 may be higher than the uppermost surface of the second semiconductor chip 200 by an interval of about 20 μM to about 100 μM, but is not limited thereto. In other words, the thickness of the first semiconductor chip 100 may be greater than the thickness of the second semiconductor chip 200.

Figure 14:
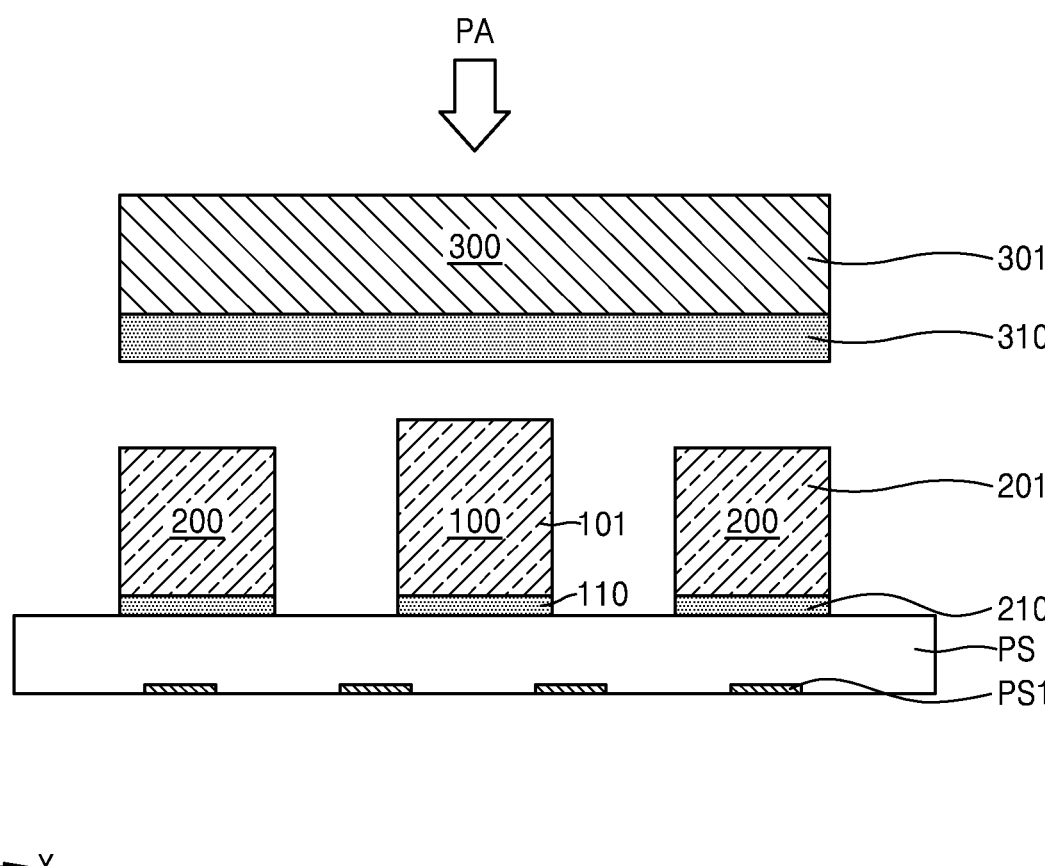

Referring to FIG. 14, the third semiconductor chip 300 may be provided on the first and second semiconductor chips 100 and 200 in operation S140.

After providing the third semiconductor chip 300 on the first and second semiconductor chips 100 and 200, pressure PA may be applied to the third semiconductor chip 300. The third semiconductor chip 300 may include the third semiconductor substrate 301, the third adhesive film 310, and a third connection member.

The third semiconductor substrate 301 may have an active surface and an inactive surface opposite to the active surface. In this case, the inactive surface of the third semiconductor substrate 301 may include a surface facing the first and second semiconductor chips 100 and 200. A plurality of memory elements may be formed on the active surface of the third semiconductor substrate 301.

The third adhesive film 310 may be arranged on a lower portion of the third semiconductor chip 300. In other words, the third semiconductor chip 300 may be arranged on an upper surface of the third adhesive film 310, and the first and second semiconductor chips 100 and 200 may be arranged under a lower surface of the third adhesive film 310.

Referring to FIG. 15, the third semiconductor chip 300 may be attached on the first and second semiconductor chips 100 and 200 in operation S150.

The third semiconductor chip 300 may be stably attached to and stacked on the first and second semiconductor chips 100 and 200, by the third adhesive film 310. The third adhesive film 310 may include, for example, the DAF.

The third connection pad may be arranged on the active surface of the third semiconductor chip 300, and the third connection member may be arranged to electrically connect the third semiconductor chip 300 to the package substrate PS.

In example embodiments, the upper portion of the first semiconductor chip 100 may be buried in the third adhesive film 310. In other words, the third adhesive film 310 may contact an uppermost surface of the first semiconductor chip 100, and in addition, may contact a portion of a sidewall extending from the uppermost surface of the first semiconductor chip 100. In addition, a thickness of a portion of the third adhesive film 310 contacting the first semiconductor chip 100 may be less than a thickness of a portion of the third adhesive film 310 contacting the second semiconductor chip 200.

Referring to FIG. 16, the molding member 400 may be formed to surround the first, second, and third semiconductor chips 100, 200, and 300 in operation S160.

The molding member 400 may be formed on the package substrate PS to surround the side surfaces, the lower surfaces, and the upper surfaces of the first, second, and third semiconductor chips 100, 200, and 300. The molding member 400 may be formed of, for example, epoxy molding compound. The molding member 400 may not be limited to the epoxy molding compound, but may include various materials, for example, an epoxy-based material, a thermosetting material, a thermoplastic material, the UV treatment material, etc.

Side surfaces and an upper surface of the molding member 400 may have a rectangular shape. In a process of cutting the package substrate PS along a dicing line into discrete semiconductor packages, the side surfaces and the upper surface of the molding member 400 in each of the discrete semiconductor packages may generally have rectangular shapes. In a portion of the side surface of the molding member 400, a marking pattern (for example, a barcode, a number, a letter, a symbol, or the like) including information about a semiconductor package may be formed.

Referring again to FIG. 2, the external connection terminal 500 may be formed on the lower electrode pad PS1 on the lower surface of the package substrate PS in operation S170. The package substrate PS may be electrically connected to a module substrate, a system board, or the like, of an electronic product via the external connection terminal 500 to be mounted thereto.

By using the method of manufacturing the semiconductor package 10 described above, the semiconductor package 10 according to example embodiments may be manufactured. As a result, the semiconductor package 10 according to example embodiments may improve the reliability and the productivity of a product, by reducing defects due to cracks in a highly integrated system in package.

Figure 17:
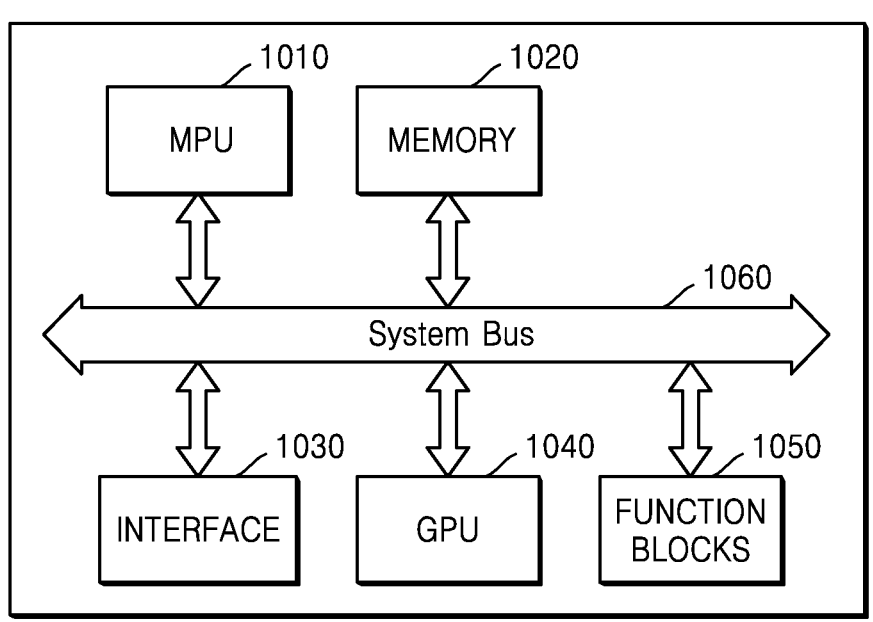
FIG. 17 is a schematic configuration diagram of a semiconductor package, according to an example embodiment.

FIG. 17 is a schematic configuration diagram of a semiconductor package 1000, according to an example embodiment.

Referring to FIG. 17, the semiconductor package 1000 may include a microprocessor 1010, a memory 1020, an interface 1030, a graphics processor 1040, function blocks (i.e., circuits) 1050, and a bus 1060 connecting these components. The semiconductor package 1000 may include both the microprocessor 1010 and the graphics processor 1040, or may also include only one of the two components.

The microprocessor 1010 may include a core and a cache. For example, the microprocessor 1010 may include a multicore. Each core of the multicore may have the same or similar performance. In addition, each core of the multicore may be simultaneously activated, or may have different time point of activation.

The memory 1020 may store results or the like processed by the function blocks 1050 under the control of the microprocessor 1010. The interface 1030 may exchange information or signals with external devices. The graphics processor 1040 may perform graphics functions. For example, the graphics processor 1040 may encode and/or decode video using a video codec, or process a 3-dimensional (3D) graphics. The function blocks 1050 may perform various functions. For example, when the semiconductor package 1000 is an application processor used by a mobile device, some of the function blocks 1050 may perform communication related functions.

The semiconductor package 1000 may include any one of the semiconductor packages 10, 20, and 30 described above with reference to FIGS. 1 through 9.

While example embodiments have been particularly shown and described, it will be understood that various changes in form and details may be made therein without departing from the spirit and scope of the following claims.

What is claimed is:

1. A semiconductor package comprising:
a package substrate;
a first semiconductor chip mounted on the package substrate;
a plurality of second semiconductor chips mounted on the package substrate, wherein the first semiconductor chip is arranged between the plurality of second semiconductor chips;
an adhesive film provided on an upper surface of the first semiconductor chip and upper surfaces of the plurality of second semiconductor chips; and
a third semiconductor chip attached to the first semiconductor chip, and the plurality of second semiconductor chips by the adhesive film,
wherein a sidewall of one of the plurality of second semiconductor chips is provided on a same plane as a sidewall of the third semiconductor chip,
wherein a portion of the third semiconductor chip, that faces the upper surface of the first semiconductor chip, is concave,
wherein a first distance from an upper surface of the package substrate to the upper surface of the first semiconductor chip is greater than a second distance from the upper surface of the package substrate to the upper surfaces of the plurality of second semiconductor chips to correspond to the concave portion of the third semiconductor chip, and
wherein a first thickness of the adhesive film at a portion thereof contacting the first semiconductor chip is less than a second thickness of the adhesive film at a portion thereof contacting the plurality of second semiconductor chips.

2. The semiconductor package of claim 1, wherein the first distance is greater than the second distance by about 20 μm to about 100 μm in a vertical direction.

3. The semiconductor package of claim 1, wherein the adhesive film contacts a sidewall of the first semiconductor chip.

4. The semiconductor package of claim 1, wherein the first semiconductor chip comprises a controller chip or a logic chip,
wherein the plurality of second semiconductor chips comprises a dummy chip, and
wherein the third semiconductor chip comprises a memory chip.

5. The semiconductor package of claim 1, further comprising:
a first bonding wire connecting the first semiconductor chip to the package substrate;
second bonding wires connecting the plurality of second semiconductor chips to the package substrate; and
a third bonding wire connecting the third semiconductor chip to the package substrate,
wherein the first bonding wire and the second bonding wires penetrate through the adhesive film.

6. The semiconductor package of claim 1, wherein a plurality of slices of each of the plurality of second semiconductor chips and the third semiconductor chip form a chip stack.

7. The semiconductor package of claim 1, further comprising a molding member provided on each of the first semiconductor chip, the plurality of second semiconductor chips and the third semiconductor chip, and filling all interspaces between the first semiconductor chip and the plurality of second semiconductor chips.

8. A semiconductor package comprising:
a printed circuit board;
a first semiconductor chip mounted on the printed circuit board by a first ball grid array;
a plurality of second semiconductor chips mounted on the printed circuit board by a second ball grid array, wherein the first semiconductor chip is arranged between the plurality of second semiconductor chips;
an adhesive film provided on an upper surface of the first semiconductor chip and upper surfaces of the plurality of second semiconductor chips; and
a third semiconductor chip attached to the first semiconductor chip and the plurality of second semiconductor chips by the adhesive film,
wherein a sidewall of one of the plurality of second semiconductor chips is provided on a same plane as a sidewall of the third semiconductor chip,
wherein a portion of the third semiconductor chip, that faces the upper surface of the first semiconductor chip, is concave, and
wherein an inactive surface of the first semiconductor chip, which contacts the adhesive film, is farther from the printed circuit board than inactive surfaces of the plurality of second semiconductor chips to correspond to the concave portion of the third semiconductor chip.

9. The semiconductor package of claim 8, wherein a first thickness of the adhesive film at a portion thereof contacting the first semiconductor chip is less than a second thickness of the adhesive film at a portion thereof contacting the plurality of second semiconductor chips.

10. The semiconductor package of claim 9, wherein the adhesive film contacts a portion of a sidewall of the first semiconductor chip.

11. The semiconductor package of claim 8, wherein the plurality of second semiconductor chips comprises a plurality of dummy semiconductor chips, and wherein the first semiconductor chip is arranged between the plurality of dummy semiconductor chips.

12. The semiconductor package of claim 11, further comprising a molding member provided on each of the first semiconductor chip, the plurality of dummy semiconductor chips and the third semiconductor chip, and filling all interspaces between the first semiconductor chip and the plurality of dummy semiconductor chips.

13. A semiconductor package comprising:

a plurality of lower semiconductor chips apart from each other on a package substrate, the plurality of lower semiconductor chips comprising a first lower semiconductor chip and a plurality of second lower semiconductor chips, wherein the first lower semiconductor chip is arranged between the plurality of second lower semiconductor chips;

a molding member filling interspaces between the plurality of lower semiconductor chips;

an adhesive film provided on an active surface of the plurality of lower semiconductor chips and the molding member; and an upper semiconductor chip provided on the adhesive film, wherein a portion of a lower surface of the upper semiconductor chip, that faces the plurality of lower semiconductor chips, is concave wherein a sidewall of one of the plurality of lower semiconductor chips is provided on a same plane as a sidewall of the upper semiconductor chip, wherein the first lower semiconductor chip is narrower and has a smaller plan area than one of the plurality of second lower semiconductor chips, and wherein an active surface of the first lower semiconductor chip is closer to the upper semiconductor chip than active surfaces of the plurality of second lower semiconductor chips to correspond to the concave portion of the upper semiconductor chip.

14. The semiconductor package of claim 13, wherein the active surface of the first lower semiconductor chip is provided on a different plane than the active surfaces of the plurality of second lower semiconductor chips.

15. The semiconductor package of claim 13, wherein the first lower semiconductor chip comprises an active chip, and wherein the plurality of second lower semiconductor chips comprises a dummy chip.

16. The semiconductor package of claim 13, further comprising a printed circuit board, wherein inactive surfaces of the plurality of lower semiconductor chips are attached to an upper surface of the printed circuit board.

17. The semiconductor package of claim 16, wherein the upper semiconductor chip comprises a plurality of stacked non-volatile memories, and wherein each of the plurality of stacked non-volatile memories is connected to the printed circuit board via a bonding wire.

\* \* \* \* \*